Sept. 21, 1965 M. M. KAUFMAN 3,207,924

LOGICAL AND CIRCUIT UTILIZING A TUNNEL DIODE

Filed April 30, 1962

INVENTOR.
MELVIN M. KAUFMAN
BY
Carl V. Olson
Attorney

United States Patent Office 3,207,924

Patented Sept. 21, 1965

3,207,924
LOGICAL AND CIRCUIT UTILIZING A TUNNEL DIODE

Melvin M. Kaufman, Merchantville, N.J., assignor to Radio Corporation of America, a corporation of Delaware Filed Apr. 30, 1962, Ser. No. 191,052
7 Claims. (Cl. 307—88.5)

Figure 1:
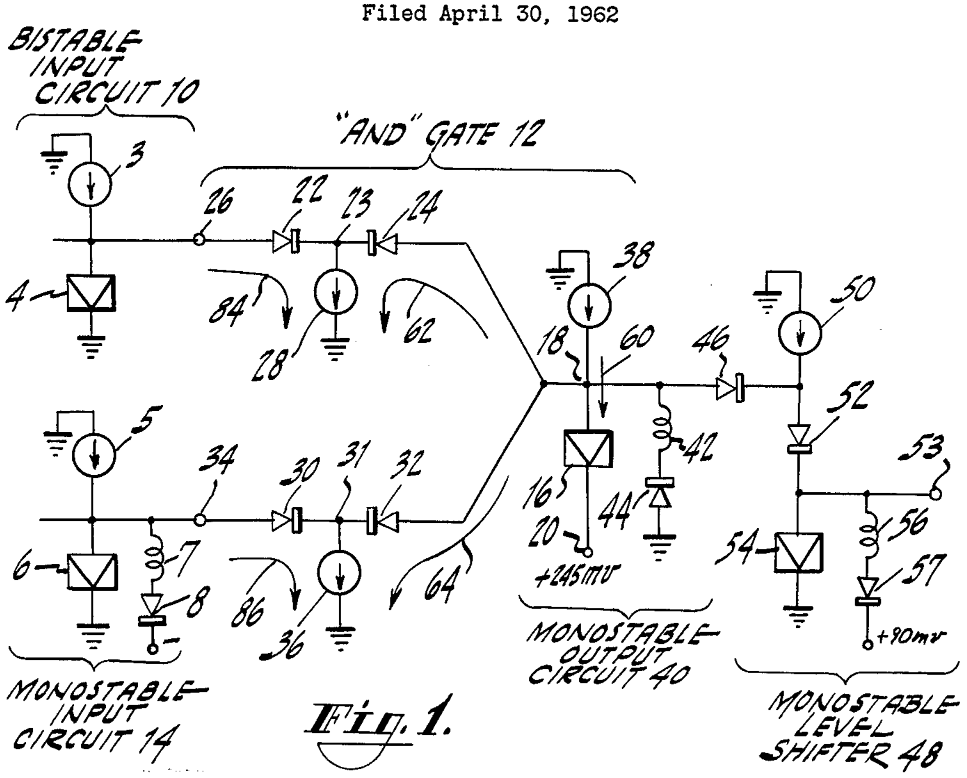

This invention relates to pulse or digital circuits including negative resistance devices such as tunnel diodes, and including non-linear impedance devices such as tunnel rectifiers, and has for its principal object the provision of such circuits so constructed as to operate reliably in response to input signal voltages that vary over a considerable range.

Tunnel diodes have the useful characteristic in certain digital data processing apparatus of switching rapidly between two stable operating states. Tunnel diode circuits including a plurality of tunnel diodes coupled in cascade for handling a digital signal involve interstage coupling problems which result from the fact that a tunnel diode is a two-terminal device. The design of multi-stage tunnel diode circuits has involved the placing of strict tolerances on the values of the circuit elements, the characteristics of the power supplies and the levels of the input and output signals of each tunnel diode stage.

The present invention teaches the coupling of a signal from one tunnel diode stage to a following tunnel diode stage in such a manner that the second tunnel diode stage operates reliably even though the voltage of the signal from the preceding tunnel diode stage varies over a considerable range of values, such as 30%.

An example of a circuit according to the invention includes an input terminal connected through first and second series tunnel rectifiers to a tunnel diode output stage. A first current source is connected to the junction between the two tunnel rectifiers. A second current source is connected to supply current to two parallel paths, one path being through the tunnel diode of the output stage, and the other path being through the second of the tunnel rectifiers and the first current source. The current through the tunnel diode is only sufficient to maintain it in its low voltage state. When an input voltage is applied to the input terminal, it causes a current flow through the first tunnel rectifier and the first current source. The portion of the current from the second current source which was flowing through the second tunnel rectifier and the first current source is then diverted to the tunnel diode causing it to switch to its high voltage state. The switching of the tunnel diode is then reliably performed even though the input signal voltage varies over a considerable range.

An "and" gate constructed according to the invention includes the above-described circuit, with different relative current source relationships, and in addition includes a second input terminal coupled through third and fourth tunnel rectifiers to the tunnel diode output circuit, and a third current source connected to the junction between the third and fourth tunnel rectifiers. The tunnel diode output circuit is reliably switched only in response to the simultaneous presence of input voltage signals on both of the input terminals.

Figure 2:
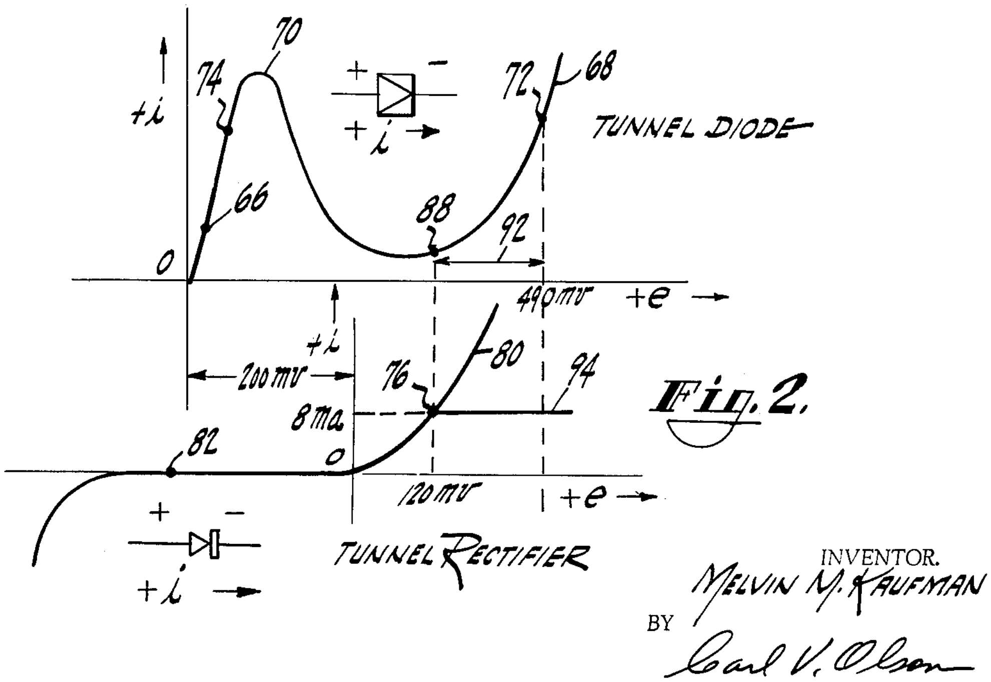

These and other objects and aspects of the invention will be apparent to those skilled in the art from the following more detailed description taken in conjunction with the appended drawing, wherein:

FIGURE 1 is a circuit diagram of a tunnel diode system including an "and" gate constructed according to the teachings of this invention; and FIGURE 2 is a chart showing characteristics of tunnel diodes and tunnel rectifiers which will be referred to in describing the operation of the circuit of FIGURE 1.

FIGURE 1 shows a tunnel diode system including a bistable input circuit 10 providing one input voltage signal for an "and" gate 12, and a monostable input circuit 14 providing another input voltage signal to the "and" gate 12. The bistable circuit 10 and the monostable circuit 14 are illustrative of tunnel diode circuits which may be used for supplying input voltage signals to the "and" gate 12. The input circuit 10 includes a current source 3 and a tunnel diode 4. The input circuit 14 includes a current source 5, a tunnel diode 6, an inductor 7 and a tunnel rectifier 8.

The "and" gate 12 includes an output tunnel diode 16 connected between the junction point 18 and the positive terminal 20 of a voltage source. The "and" gate 12 also includes two oppositely poled tunnel rectifiers 22 and 24 connected in series between the junction point 18 and a signal input voltage terminal 26. A current source 28 is connected from the junction point 23 between the tunnel rectifiers 22 and 24 to a point of reference potential such as ground. The source 28 is poled to cause a current flow in the easy current flow direction through both rectifiers 22 and 24. A current source is a source designed to supply a substantially constant current to the load to which it is connected. By contrast, a voltage source is one that supplies a substantially constant voltage.

A second pair of oppositely poled tunnel rectifiers 30 and 32 is connected in series between the point 18 and a second input terminal 34. A constant current source 36 is connected to the junction point 31 between the tunnel rectifiers 30 and 32 and a point of reference potential such as ground. The source 36 is poled to cause a current flow in the easy current flow direction through the rectifiers 30 and 32.

A constant current source 38 is connected to supply current to the junction point 18 and the anode of the tunnel diode 16. The current source 38 and the tunnel diode 16 in the "and" gate 12 are part of a monostable output circuit 40 which also includes an inductor 42 and a tunnel rectifier 44. The monostable output circuit 40 can be replaced by a bistable circuit which may not have the inductor 42. If a bistable circuit is employed, it should include means for applying a reset signal to the junction point 18.

The output of the monostable output circuit 40 is coupled through a tunnel rectifier 46 to a monostable level shifter circuit 48 including a current source 50, a level shifting tunnel rectifier 52, a tunnel diode 54, an inductor 56 and a rectifier 57.

The constant current source 38 in the output circuit 40 supplies a constant current which can flow in three parallel paths 60, 62 and 64. The maximum current that can flow in the path 62 is determined by the current source 28, and the maximum current which can flow in the path 64 is determined by the constant current source 36. The constant current source 38 is designed so that when the maximum currents are flowing in the paths 62 and 64, the remainder current flowing in the path 60 through the tunnel diode 16 has a value to bias the tunnel diode 16 in the low voltage, low current, positive resistance region of its current-voltage characteristic. Such a point is shown in FIGURE 2 as the point 66 on the typical current-voltage characteristic 68 of a tunnel diode. The values of the current sources 28, 36 and 38 are selected so that when no current flows in the paths 62 and 64, the entire current flowing from the current source 38 through the tunnel diode 16 is sufficient to switch the operating point of the tunnel diode over the current peak 70 (FIGURE 2) to a point 72 on the high voltage, positive resistance region of its characteristic 68. By way of example, the source 38 may supply a constant current of 22 milliamperes, and the current sources 28 and 36 may supply constant currents of 8 milliamperes each.

The operation of the system of FIGURE 1 will now be described starting with an initial condition in which all of the tunnel diodes 4, 6, 16 and 54 are in their low voltage states. Input tunnel diodes 4 and 6 are at low voltage operating points such as the point 74 on the tunnel diode characteristic curve 68 of FIGURE 2. Therefore, the voltage at the input terminals 26 and 34 of the "and" gate 12 may be about 80 millivolts.

The output circuit tunnel diode 16 may be at a low voltage operating point such as the point 66 on the characteristic curve 68. The point 18 at the anode of output tunnel diode 16 may be at a voltage of about 325 millivolts, due to an 80 millivolt drop across the diode 16 which has its cathode connected to a 245 millivolt source terminal 20. The current source 38 in the output circuit 40 supplies a current which divides into a first path 60 through the output tunnel diode 16, a second path 62 through the tunnel rectifier 24 and the current source 28, and a third path 64 through the tunnel rectifier 32 and the current source 36. The high positive voltage at point 18 and at the anodes of tunnel rectifiers 24 and 32 causes the currents through the rectifiers 24 and 32 to be in the easy current flow direction. The currents through rectifiers 24 and 32 cannot exceed the current ratings of the current sources 28 and 36. Therefore, the operating points of the rectifiers 24 and 32 are at points such as 76 on their current-voltage characteristics as represented by the curve 80 in FIGURE 2. If the currents in the paths 62 and 64 are each 8 milliamperes as determined by the sources 28 and 36, and if the current source 38 supplies a total of 22 milliamperes, then only 6 milliamperes (22—8—8) remain for the path 60 including the output tunnel diode 16. The input tunnel rectifiers 22 and 30 are non-conducting because they are reversed biased at an operating point such as the point 82 on the tunnel rectifier characteristic 80.

If the bistable input circuit 10 switches to its high voltage state, the voltage at the input terminal 26 switches to a voltage such as 490 millivolts as represented by the operating point 72 in the high voltage region of the tunnel diode characteristic 68. This input voltage renders tunnel rectifier 22 conductive and permits the flow of the full 8 milliamperes of the current source 28 in the path 84 from input terminal 26 through the tunnel rectifier 22 and the current source 28. This current flow causes the tunnel rectifier 24 to be back-biased and thereby rendered non-conductive. Therefore, the current from the current source 38 previously flowing in path 62 is diverted to the path 60 including the tunnel diode 16. The operating point of the output tunnel diode 16 then moves to a point such as the point 74 on the characteristic curve 68. Thus, the one input voltage signal applied to the one input terminal 26 of the "and" gate 12 does not cause the tunnel diode 16 to switch from its low voltage state to its high voltage state.

If, during the presence of the high voltage input signal at the input terminal 26, a voltage input pulse is supplied to the other input terminal 34 by the monostable circuit 14, the voltage pulse renders the tunnel rectifier 30 fully conductive so that 8 milliamperes flow in the path 86 through the tunnel rectifier 30 and the 8 milliampere current source 36. The current from the current source 38 previously flowing in the path 64 is then diverted to the path 60 including the tunnel diode 16. This additional current through the tunnel diode 16 causes the operating point to move from the point 74 up over the current peak 70 to an operating point such as the point 72 in the high voltage region of its characteristic. The output circuit 40 is thus switched so that it generates a pulse having a duration determined primarily by the value of the inductor 42.

Because the cathode of the tunnel diode 16 is positively biased at bias terminal 20, the amplitude of the pulse at point 18 may be about 725 millivolts. The output pulse of the monostable output circuit 40 is coupled to the monostable level shifter 48 which provides a corresponding output pulse at the output terminal 53. The output of the level shifter 48 is at a value, such as about 490 millivolts, which is consistent with the levels of the system. The output of the level shifter 48 is suitable for application to the input of other tunnel diode circuits like the bistable circuit 10 or the monostable circuit 14. The level shifting in the level shifter is accomplished by the tunnel rectifier 52.

After a voltage level has been applied to input terminal 26, the monostable output circuit 40 is reliably switched from its low voltage to its high voltage state by the voltage pulse applied to the second input terminal 34. This switching of the output circuit 40 is reliably accomplished despite considerable variation in the amplitude of the voltage pulse applied to the input terminal 34. The reason for this characteristic of the circuit will be explained with reference to FIGURE 2.

The output voltage of the monostable circuit 14 may be a voltage having any value between the points 88 and 72 in the high voltage region of the characteristic 68. The tunnel rectifier characteristic 80 represents the characteristic of the tunnel rectifier 30. The zero voltage axes of the tunnel diode characteristic 68 and the tunnel rectifier characteristic 80 are displaced about 200 millivolts to represent the voltage existing at the junction point 31 (FIGURE 1) when current is flowing in the path 64. Whenever the voltage at input terminal 34 from tunnel diode 6 corresponds with the voltage of point 88 on the characteristic 68, the tunnel rectifier 30 has an operating point 76 on characteristic 80. The tunnel rectifier then conducts the full 8 milliamperes that can pass through the constant current source 36. When a higher voltage is applied to input terminal 34 due to the operating point of the tunnel diode 6 being between points 88 and 72, it is still not possible for more than 8 milliamperes to flow in the path 86. Therefore, input voltages at terminal 34 in the range represented at 92 result in a substantially constant current 94 in the path 86.

It is thus seen that the input voltage at terminal 34 may vary over a wide range without adversely affecting the reliability of operation of the output circuit 40. The circuit according to the invention provides an isolation between the input terminal 34 and the output tunnel diode 16 which prevents an undesired interaction between the two-terminal tunnel diodes 6 and 16. The same relaxed tolerance exists for the voltage level input supplied to the input terminal 26 from the bistable circuit 10.

While the invention has been illustrated in FIGURE 1 as an "and" gate 12 having two inputs 26 and 34, it will be understood that the advantages of the invention may be obtained in circuits having only one input or having more than two inputs. In all cases, the output tunnel diode circuit operates reliably with input voltage signals which may vary over a considerable range due to the curvature of the high voltage positive resistance region of the input circuit tunnel diode characteristic.

What is claimed is:

1. A circuit comprising a tunnel diode, an input terminal, first and second tunnel rectifiers connected in series and in opposite polarities from said input terminal to said tunnel diode, a first current source connected to the junction between said tunnel rectifiers, a second current source connected to cause a current flow in a first path through said tunnel diode and in a second parallel path through said second tunnel rectifier and said first current source, and means to apply a control voltage to said input terminal.

2. A circuit comprising a tunnel diode, an input terminal, first and second tunnel rectifiers connected in series and in opposite polarities from said input terminal to said tunnel diode, a first current source connected to the junction between said tunnel rectifiers and having a polarity to cause a current flow in both tunnel rectifiers in their easy current flow direction, and a second current source connected to cause a current flow in a first path through said tunnel diode and in a second parallel path through said second tunnel rectifier and said first current source, whereby a control voltage applied to said input terminal causes a change in the division of current from said second current source through said first and second parallel paths which alters the state of the tunnel diode in said first path.

3. A circuit comprising a tunnel diode, an input terminal, first and second tunnel rectifiers connected in series and in opposite polarities from said input terminal to said tunnel diode, a first current source connected to the junction between said tunnel rectifiers and having a polarity to cause a current flow in both tunnel rectifiers in their easy current flow direction, a second current source connected to cause a current flow in a first path through said tunnel diode and in a second parallel path through said second tunnel rectifier and said first current source, and means to apply a control voltage to said input terminal to cause a change in a current in a third path from said input terminal and through said first tunnel rectifier and said first current source, and to thereby cause a change in the division of current from said second current source through said first and second parallel paths which alters the state of the tunnel diode in said first path.

4. A multiple input circuit comprising a tunnel diode, first and second input terminals, first and second tunnel rectifiers connected in series between said first input terminal and said tunnel diode, a first current source connected to the junction between said first and second tunnel rectifiers, a second current source connected to said tunnel diode, third and fourth tunnel rectifiers connected in series between said second input terminal and said tunnel diode, a third current source connected to the junction between said third and fourth tunnel rectifiers, and means to apply input control voltages to said first and second input terminals.

5. A multiple input circuit comprising a tunnel diode, first and second input terminals, first and second tunnel rectifiers connected in series between said first input terminal and said tunnel diode, a first current source connected to the junction between said first and second tunnel rectifiers, a second current source connected to said tunnel diode, third and fourth tunnel rectifiers connected in series between said second input terminal and said tunnel diode, a third current source connected to the junction between said third and fourth tunnel rectifiers, said second current source being constructed to provide a current which divides among a first path through the tunnel diode, a second path through the second tunnel rectifier and the first current source, and a third path through the fourth tunnel rectifier and the third current source, and means to control the division of current in said three paths by applying input control voltages to said first and second input terminals.

6. An "and" gate circuit comprising a tunnel diode, first and second input terminals, first and second tunnel rectifiers connected in series and in opposite polarities between said first input terminal and said tunnel diode, a first current source connected to the junction between said first and second tunnel rectifiers, a second current source connected to said tunnel diode, third and fourth tunnel rectifiers connected in series and in opposite polarities between said second input terminal and said tunnel diode, a third current source connected to the junction between said third and fourth tunnel rectifiers, said second current source being constructed to provide a current which divides among a first path through the tunnel diode, a second path through the second tunnel rectifier and the first current source, and a third path through the fourth tunnel rectifier and the third current source, and means to control the division of current in said three paths by applying input control voltages to said first and second input terminals, whereby the state of said tunnel diode in controlled reliably even though the input control voltages vary over a considerable range.

7. A circuit comprising a tunnel diode, an input terminal, first and second tunnel rectifiers connected in series and in opposite polarities from said input terminal to said tunnel diode, a first current source connected to the junction between said tunnel rectifiers, a second current source connected to normally cause a current flow in a first path through said tunnel diode and in a second parallel path through said second tunnel rectifier and said first current source, and means to apply a control voltage to said input terminal to cause an input current to said first current source which displaces the current thereto from said second current source, whereby the displaced current from said second current source is directed through said first path including said tunnel diode.

References Cited by the Examiner

UNITED STATES PATENTS

| | | | |
|---|---|---|---|
| 2,959,689 | 11/60 | Gilbert | 307—88.5 |
| 2,986,652 | 5/61 | Eachus | 307—88.5 |
| 3,126,488 | 3/64 | Johnson | 307—88.5 |

OTHER REFERENCES

A Study of Tunnel Diodes for Digital Electronic Circuits, Hemmel solid/state/design (Technical section), March 1962, pages 31–38.

Application of Tunnel Diodes in Switching Circuits, Kunihiro, Univ. of Ill., Grad. College, Digital Computer Lab. Report #102, October 26, 1960, page 6.

Design of Transistorized Circuits for Digital Computers by Pressman, 1959, pages 11–309.

Non-Linear Diode Logic Circuit, I.B.M. Tech. Disclosure Bulletin, volume 1, No. 6, L. H. Thomas, April 1959, pages 27–30.

ARTHUR GAUSS, *Primary Examiner.*